(12) United States Patent
Lodha et al.

(10) Patent No.: US 7,861,406 B2
(45) Date of Patent: Jan. 4, 2011

(54) METHOD OF FORMING CMOS TRANSISTORS WITH DUAL-METAL SILICIDE FORMED THROUGH THE CONTACT OPENINGS

(75) Inventors: Saurabh Lodha, Hillsboro, OR (US); Pushkar Ranade, Hillsboro, OR (US); Christopher Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 664 days.

(21) Appl. No.: 11/693,608

(22) Filed: Mar. 29, 2007

(65) Prior Publication Data
US 2008/0237603 A1 Oct. 2, 2008

(51) Int. Cl.
*H01R 43/00* (2006.01)
(52) U.S. Cl. .............................. 29/827; 29/842; 29/847; 257/69; 257/255; 257/757; 257/407; 257/408; 438/233; 438/285

(58) Field of Classification Search .................. 29/827, 29/842, 847; 257/69, 191, E21.409, E21.632, 257/E29.255, 757, 250, 407, 408; 438/233, 438/285
See application file for complete search history.

(56) References Cited

U.S. PATENT DOCUMENTS 6,905,922 B2 * 6/2005 Lin et al. .................... 438/199

* cited by examiner

*Primary Examiner*—Paul D Kim
(74) *Attorney, Agent, or Firm*—Kathy J. Ortiz

(57) ABSTRACT

Methods and associated structures of forming a microelectronic device are described. Those methods may include amorphizing at least one contact area of a source/drain region of a transistor structure by implanting through at least one contact opening, forming a first layer of metal on the at least one contact area, forming a second layer of metal on the first layer of metal, selectively etching a portion of the second metal layer, annealing the at least one contact area to form at least one silicide, and removing the unreacted first metal layer and second metal layer from the transistor structure and forming a conductive material in the at least one contact opening.

7 Claims, 3 Drawing Sheets

METHOD OF FORMING CMOS TRANSISTORS WITH DUAL-METAL SILICIDE FORMED THROUGH THE CONTACT OPENINGS

BACKGROUND OF THE INVENTION

In conventional MOSFET (metal on oxide field effect transistor) fabrication, silicide formation may be preceded by an implantation to amorphize exposed silicon surfaces of diffusion areas. However, in conventional self-aligned processes, the amorphizing implant may extend into and damage the crystalline nature of active channel regions of such a transistor. This has become a greater concern as MOSFET device geometries become smaller, since the thickness of a spacer separating the amorphizing implant from a channel is made thinner to enable transistor pitch scaling.

Silicide formed after the implant is typically closer to the channel and, as MOSFET scaling leads to shorter channel length devices, the risk of metal diffusion through defects in the channel region is high. Additionally, the use of a single metal species for silicidation may result in work functions that may not be adequately tuned to lower contact resistance for both NMOS and PMOS source/drain regions.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
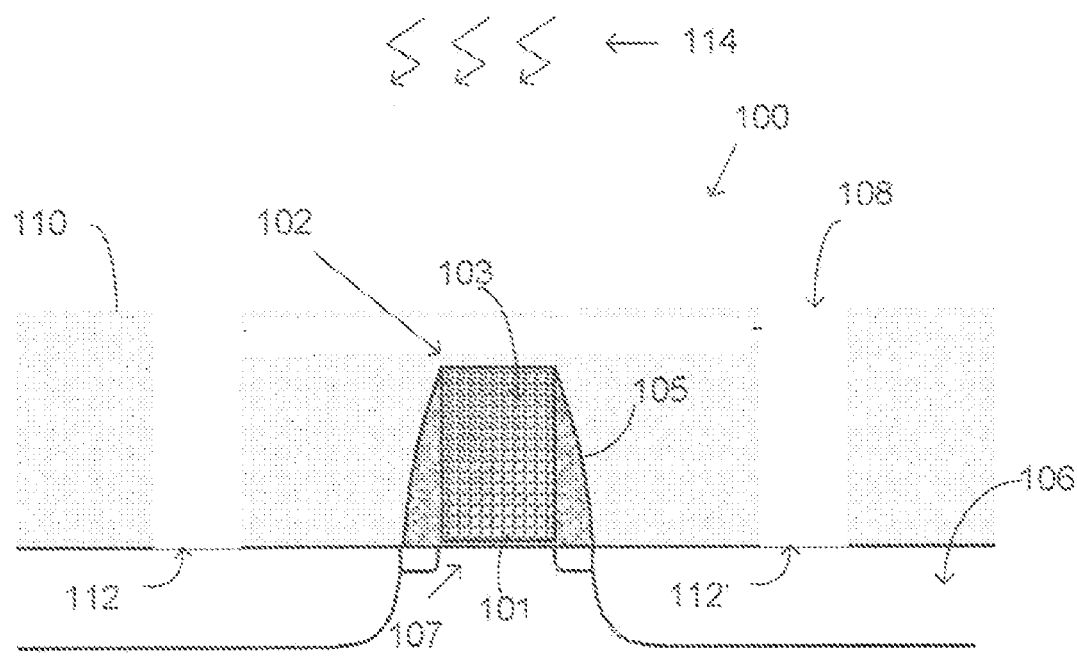
FIGS. 1a-1d represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include amorphizing at least one contact area of a source/drain region of a transistor structure by implanting through at least one contact opening, forming a first layer of metal on the at least one contact area, forming a second layer of metal on the first layer of metal, selectively etching a portion of the second metal layer, and annealing the at least one contact area to form at least one silicide. Methods of the present invention decrease the risk of source-drain/source-substrate shorting due to metal diffusion through crystalline silicon areas, and enables the selective tuning of the silicide work-function for NMOS and PMOS diffusion regions.

FIGS. 1a-1d illustrate an embodiment of a method of forming a microelectronic structure, such as source/drain contacts of transistor structure, for example. FIG. 1a illustrates a cross-section of a portion of a transistor structure 100. The transistor structure 100 may comprise a gate region 102 that may comprise a gate oxide region 101 and a gate 103. The transistor structure 100 may also comprise a spacer 105 and a channel region 107 located beneath the gate oxide region 101. The transistor structure 100 may further comprise a source/drain region 106, which may be located adjacent at least one side of the gate region 102. In one embodiment, the source/drain 106 regions may comprise silicon and/or silicon containing materials, but the particular material will depend upon the application.

In one embodiment, the transistor structure 100 may comprise at least one contact opening 108. The at least one contact opening 108 may be formed within an isolation region 110. The at least one contact opening 108 may expose at least one contact area 112 of the source/drain region 106. In one embodiment, the at least one contact area 112 may comprise at least two types of contact areas 112, 112'. In one embodiment, the two types of contact areas 112, 112' may comprise a PMOS contact area 112 and an NMOS contact area 112'. In one embodiment, one type of contact area may comprise an NMOS contact area, while the other type of contact area may comprise a PMOS contact area, and vice versa.

In one embodiment, an ion implant process 114 may be performed through the at least one contact opening 108 on/in the source/drain region 106. In one embodiment, ion species such as, but not limited to germanium, nitrogen, silicon, argon, or the like may be implanted into the source/drain region 106 in order to amorphize the crystalline source/drain region 106 prior to a subsequent silicide process.

Implanting through the at least one contact hole 108 (as opposed to implanting the entire source/drain region 106) confines the implant to the contact areas 112, 112', thus preventing implant damage of the crystalline nature of the active channel region 107 of the transistor. This is a greater concern for MOSFET scaling, where the thickness of the spacer 105 separating the implant 114 from the channel 107 may be extremely thin in order to enable transistor pitch scaling towards smaller geometries.

Figure 1B:
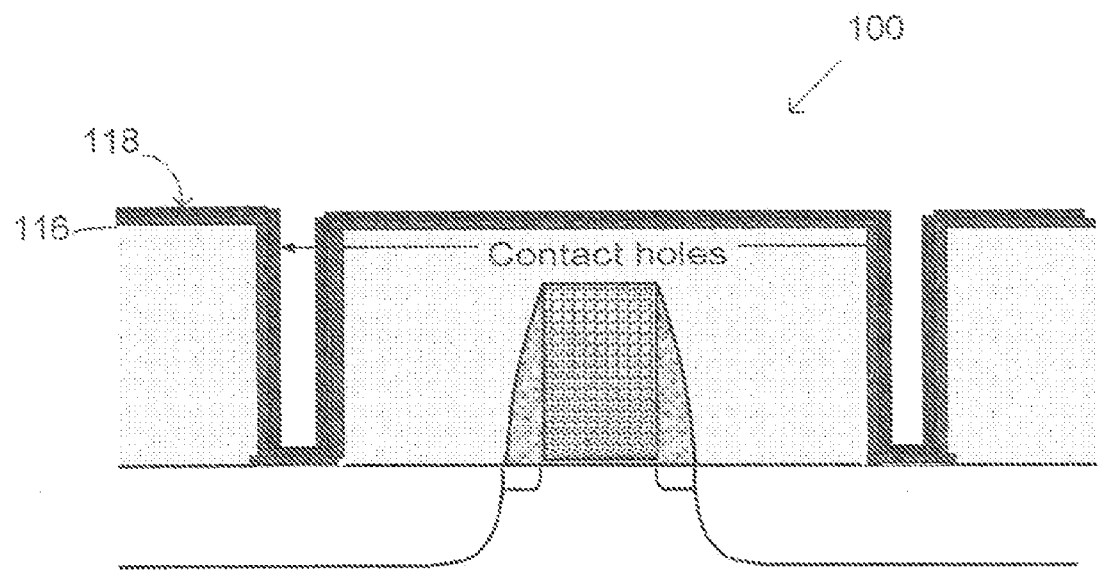

In one embodiment, a first metal layer 116 may be formed on the isolation region 110 and on the contact areas 112, 112' (FIG. 1b). A second metal layer 118 may be formed on the first metal layer 116, and may be disposed over the contact regions 112, 112'. The first metal layer 116 and the second metal layer 118 may comprise different sets of materials, depending upon the particular application. In one embodiment, the metal layers 116, 118, may be formed by utilizing a physical vapor deposition process, such as but not limited to a chemical vapor deposition (CVD) process, to obtain good bottom coverage for high aspect ratio contacts, in some cases.

For example, the first metal layer 116 may be such that it comprises a work function compatible with a PMOS type contact area 112, while the second metal layer 118 may be chosen to be compatible with an NMOS type contact area 112'. In this manner, utilizing two different types of metal for two different types of contact areas 112, 112' allows for the selective tuning of the silicide work-function for an NMOS and a PMOS diffusion region, for example. I In one embodiment, in order to maximize the performance of both devices (NMOS, PMOS) on a single substrate, (such as a silicon wafer), for example, metal materials that form a silicide with a low barrier height (~4 eV) for an NMOS device and metal materials that form high barrier height (~5 eV) for PMOS devices may be utilized for the first metal layer and the second metal layer. Thus, embodiments of the present invention can enable dual silicide formation on a single wafer.

Silicides such as those comprising platinum and nickel comprise relatively high barrier heights, while those of tantalum, titanium and erbium may comprise relatively low barrier heights. In addition, alloyed silicides may be formed on the contact areas 112, 112' and tuned with respect to their work functions depending upon the material choice for the metal layers 116, 118 and their concentrations (e.g. a nickel silicide may be doped with platinum to increase the barrier height while doping nickel silicide with aluminum or titanium can lower the barrier height).

Figure 1C:
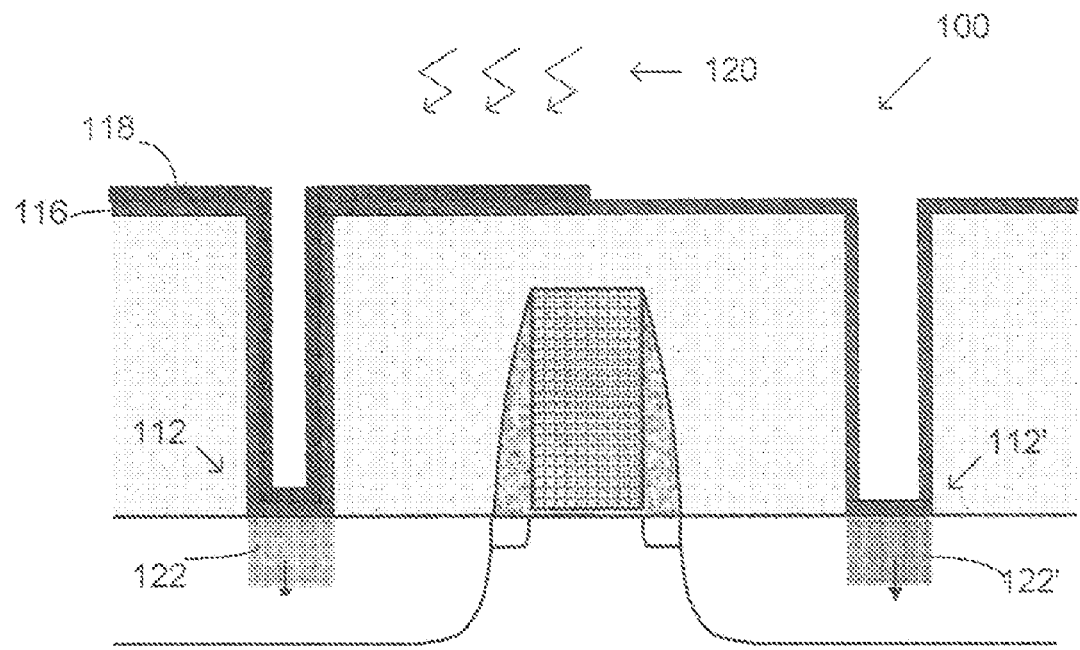

The second metal layer 118 may be selectively etched over one of the types of contact areas 112, 112', while it may not be etched from the other type of contact area 112, 112' (FIG. 1c). For example, the second metal layer 118 may remain over the contact area 112, but may be removed over the contact area 112'. In one embodiment, the selective etch may comprise a chemistry, either utilizing a dry or wet etch process, that comprises a high selectivity (etch rate) for the second metal layer 118 and little to no etch rate for the first metal layer 116. An anneal 120 may be performed subsequent the selective etching of the second metal layer 118 to form a silicide 122, 122' in the contact areas 112, 112' respectively.

Because both of the metal layers 116, 118 may remain over just one type of contact region 112, 112', the silicides 122, 122' may be tuned, as described above to tailor the work function of an NMOS contact area and a PMOS contact area independently. For example, the PMOS contact area 112 may react with both of the first metal layer 116 and the second metal layer 118 to form the silicide 122, and the NMOS contact area 112' may react with the only the first metal layer 116 to form the silicide 122'. In one embodiment, a first silicide 122 disposed on/in the PMOS contact area 112 may comprise a different work function than a second silicide 122' disposed on/in the NMOS contact area 112'.

Figure 1D:
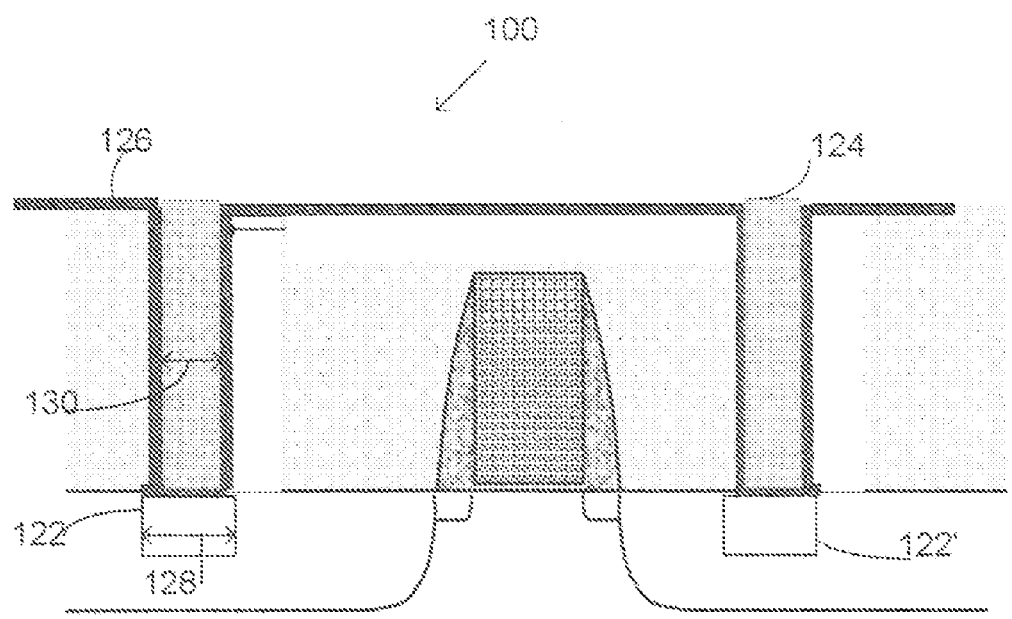

After the silicide 122, 122' are formed, the metal layers 116, 118 may then be removed from the transistor structure 100 utilizing any suitable technique, such as a dry or wet, etch, and a conductive material 124 may then be formed in the contact opening to fill the contact opening (FIG. 1d). The conductive material 124 may comprise tungsten and/or copper, for example, and may further comprise various other layers, such as barrier and/or adhesion layers 126, depending upon the application. In one embodiment, a width 128 of at least one of a first silicide 122 and a second silicide 122' is within about 20 percent of a width 130 of the conductive material 124.

Figure 2A:
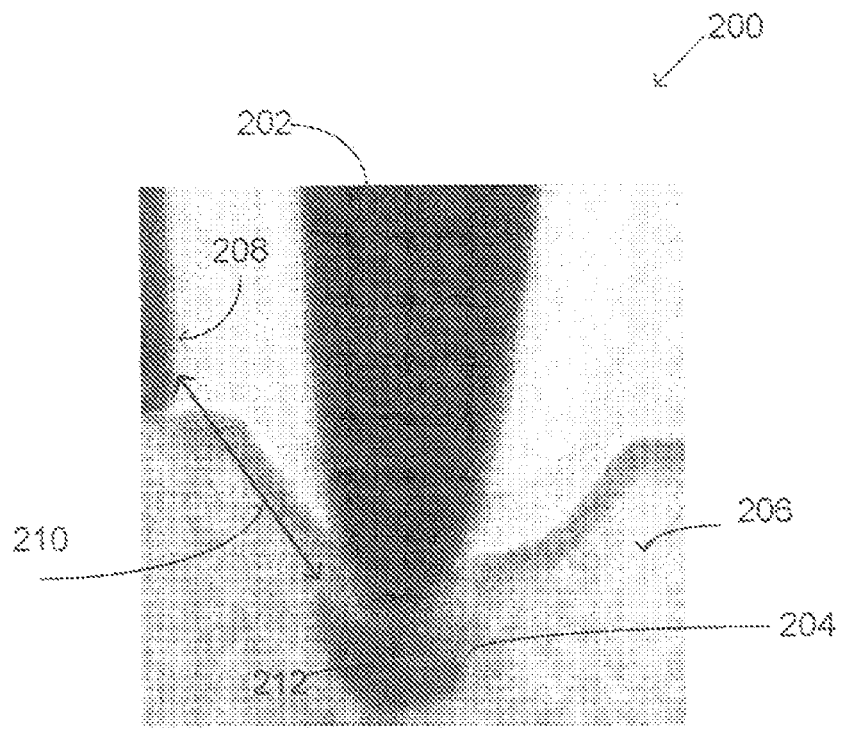
FIG. 2a represents structures according to an embodiment of the present invention.
Figure 2B:
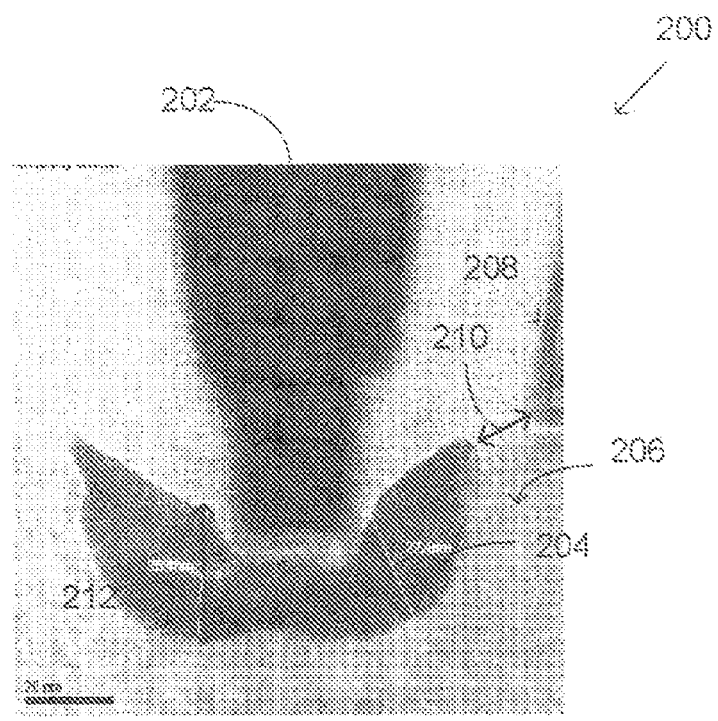
FIG. 2b represents structures from the Prior Art.

FIG. 2a depicts a contact structure 200 formed according to the embodiments of the present invention, comprising a source/drain region 206, a contact fill material 202, a silicide structure 204 in the source drain region 206, and a portion of a gate edge 208. In one embodiment, a distance 210 between the silicide structure 204 and the gate edge 208 may comprise between about 15 to about 30 nm. In one embodiment, a thickness 212 of the silicide structure 204 may comprise below about 15 nm. FIG. 2b depicts a Prior Art contact structure 200 comprising a source/drain region 206, a contact fill material 202, a silicide structure 204 in the source drain region 206, and a portion of a gate edge 208. A thickness 212 of the silicide structure 204 may comprise above about 25 nm.

A distance 210 between the silicide structure 204 and the gate edge 208 may comprise between about 5 to about 10 nm. Because the silicide structure 204 of FIG. 2a is formed through a contact opening, the silicide structure 204 comprises much smaller dimensions than the Prior Art silicide structure depicted in FIG. 2b. The formation of localized silicidation of the various embodiments reduces the risk of source-to-drain and source-to-substrate shorts, protect the channel region from implant damage, and eliminate polysilicide defects by selectively siliciding contact regions only.

Embodiments of the present invention further enable the formation of low resistance contacts through selective tuning of the silicide work-function for NMOS and PMOS source/drain regions by enabling a dual-metal silicide process. Embodiments of the present invention also enable a silicide process which is self-aligned to source/drain contacts.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic structures are well known in the art. Therefore, it is appreciated that the Figures provided herein illustrate only portions of exemplary microelectronic structures that pertain to the practice of the present invention. Thus the present invention is not limited to the structures described herein.

What is claimed is:

1. A method comprising:
    amorphizing at least one contact area of a source/drain region of a transistor structure by implanting through at least one contact opening;
    forming a first layer of metal on the at least one contact area;
    forming a second layer of metal on the first layer of metal;
    selectively etching a portion of the second metal layer;
    annealing the at least one contact area, wherein the at least one contact area reacts with at least one of the first metal and the second metal to form at least one silicide; and
    removing the first metal layer and of the second metal layer from the transistor structure and forming a conductive material in the at least one contact opening.

2. The method of claim 1 further comprising wherein the transistor structure comprises two types of contact areas, wherein the two types comprise a PMOS contact area and an NMOS contact area.

3. The method of claim 2 further comprising wherein one of the two types reacts with both of the first metal layer and the second metal layer to form one of the at least one silicide, and the other of the two types reacts with only the first metal layer to form another of the at least one silicide.

4. The method of claim 2 wherein selectively etching the second metal layer comprises etching the second metal layer disposed over one type of contact area, and not etching the second metal layer disposed over the other type of contact area.

5. The method of claim 2 further comprising forming a first silicide in one type of contact area comprising a first work function and forming a second silicide in the other type of contact area comprising a second work function.

6. The method of claim 1 further comprising wherein the first metal layer and the second metal layer comprise different work functions.

7. The method of claim 1 further comprising wherein a distance between a bottom corner of the gate and the at least one silicide is greater than about 15 nm.

\* \* \* \* \*